(12) United States Patent
Edmonson et al.

(10) Patent No.: US 6,827,281 B2
(45) Date of Patent: Dec. 7, 2004

(54) ENCODED SAW RFID TAGS AND SENSORS FOR MULTI-USER DETECTION USING IDT FINGER PHASE MODULATION

(75) Inventors: Peter J. Edmonson, Hamilton (CA); Colin K. Campbell, Ancaster (CA)

(73) Assignee: P. J. Edmonson Ltd., Hamilton (CA)

( * ) Notice: Subject to any disclaimer, the term of this patent is extended or adjusted under 35 U.S.C. 154(b) by 4 days.

(21) Appl. No.: 10/323,827

(22) Filed: Dec. 20, 2002

(65) Prior Publication Data

US 2004/0118929 A1 Jun. 24, 2004

(51) Int. Cl.⁷ .............................................. G06K 19/06
(52) U.S. Cl. ........................................................ 235/492
(58) Field of Search ........................... 235/492; 342/42, 342/44, 51; 310/313

(56) References Cited

U.S. PATENT DOCUMENTS

| | | | | |
|---|---|---|---|---|
| 4,169,286 A | * | 9/1979 | Uzunoglu et al. | 708/815 |
| 4,737,790 A | * | 4/1988 | Skeie et al. | 342/51 |
| 4,746,830 A | * | 5/1988 | Holland | 310/313 D |
| 5,469,170 A | * | 11/1995 | Mariani | 342/51 |
| 6,122,329 A | * | 9/2000 | Zai et al. | 375/329 |
| 6,427,919 B1 | * | 8/2002 | Toda | 235/492 |
| 6,531,957 B1 | * | 3/2003 | Nysen | 340/10.1 |

* cited by examiner

Primary Examiner—Thien M. Le
Assistant Examiner—April Taylor
(74) Attorney, Agent, or Firm—Robert F. Delbridge

(57) ABSTRACT

A group of SAW RFID tags or sensors each has a transducer with interdigitated fingers, a different set of fingers in each tag or sensor being reversed in phase to cause the tag or sensor to provide a unique identifier in a returned impulse response produced by the tag or sensor when interrogated by an interrogation signal.

13 Claims, 9 Drawing Sheets

Magnitude Code 1 1 1 1 1 1 1 -1 -1 1

Phase Code 1 1 1 1 1 1 1 -1 -1 1

Anti-Collision Example

Example of decoding four 10-bit codes from an unknown number of impinging codes that have collided at the interrogation device

ENCODED SAW RFID TAGS AND SENSORS FOR MULTI-USER DETECTION USING IDT FINGER PHASE MODULATION

FIELD OF INVENTION

This invention relates to multi-user detection of SAW RFID tags and sensors.

BACKGROUND OF INVENTION

RFID tags are somewhat similar to bar codes in that they each have a unique identification code, but RFID tag codes can be retrieved wirelessly without relying on close line-of-sight contact. Such RFID tags are used for identification or logistic purposes such as in warehouses, manufacturing or commercial outlets. Specific measurement parameters can also be extracted from certain SAW RFID configurations to produce a passive wireless sensor capable of conveying an identification code if required along with temperature, pressure or other similar measurements back to an interrogation reader. Such uniquely identifiable sensors would be well suited for the automotive industry where a single reader located in an automobile could communicate and monitor pressure, temperature and other useful parameters.

For the simple case of a single SAW RFID tag or sensor within the effective e range of an interrogation transceiver; the following events take place:

a. An interrogation transceiver emits an interrogation signal through its single antenna.

b. The RFID tag or sensor which is typically located 1 to 2 meters away, receives the interrogation signal via its own antenna and couples the signal to the SAW's encoded interdigital transducer (IDT).

c. The acoustic wave produced by the IDT propagates either within the same extended IDT or propagates away and is then reflected backing reflection gratings to the IDT with encoded information specific to that particular tag or sensor.

d. This encoded signal couples from the IDT to the antenna and pro agates through the air back to the single antenna of the interrogation transceiver.

e. Identification information or sensor parameters are then extracted from the returned signal and identified by a reader.

A major problem exists if there are two or more tags or sensors within the range of the interrogation transceiver. Multiple tags or sensors will be performing steps b, c and d as outlined above more or less simultaneously and causing a collision of data at the interrogation transceiver and with consequent inability of the reader to accurately decode the identification codes.

Researchers from Germany have proposed several solutions to solve the multiple access problems. One solution, A. Pohl, F. Seifert, L. Reindl, G. Scholl, T. Ostertag and W. Pietschl, "Radio Signals For Saw ID Tags And Sensors In Strong Electromagnetic Interference," Proceedings 1994 IEEE Ultrasonics Symposium, pp.195–198, 1994., outlines how a 5-path RAKE receiver is used to solve the multiple access problem. Another solution was presented, G. Ostermayer I, A. Pohl, L. Reindl and F. Seifert "Multiple Access to SAW Sensors Using Matched Filter Properties," Proceedings 1997 IEEE Ultrasonic Symposium, pp.339–342, 1997., where they presented a method of matched filters to solve the problem of access to more than one passive SAW sensor that is within the range of an interrogation transceiver.

These two papers by the German researchers describe multi-user detection (MUD) which depends on spectral analysis to determine individual characteristics of each tag or sensor.

U.S. Pat. No. 5,500,651 describes an arrangement in which a first interrogation signal is transmitted from the interrogation reader. This first interrogation signal having a first read range. A first response signal is then received at the reader after which a second interrogation signal is transmitted from the reader. The second interrogation signal has a second read range which is different than said first read range. The read range can be varied by varying either the amplitude or duration of the power level of the interrogation signal. A second response signal is then received at the reader. These consecutive responses are then compared to determine a correct response signal which can be displayed.

U.S. Pat. No. 6,034,603 describes a data transmission system which includes a reader transceiver and one or more semiconductor-based tag transceivers. The reader transmits an activation signal to a semiconductor-based tag. The tag selectively transmits a response signal to the reader at a specific time determined by a detected level of communications channel activity.

U.S. Pat. No. 6,150,921 describes a system for tracking mobile tags. Cell controllers with multiple antenna modules generate a carrier signal which is received by the tags. Tags shift the frequency of the carrier signal, modulate an identification code onto it, and transmit the resulting tag signal at randomized intervals.

U.S. Pat. No. 6,377,203 describes a method for simultaneously reading a serial number and/or other information from multiple colliding RF signals from RF identification tags requires minimal additional logic in the semiconductor-based tag's processor and provides for a powerful and rapid sorting and identification scheme. This technique employs a primary communication channel and multiple secondary channels.

U.S. Pat. No. 6,392,544 describes a radio frequency identification reader which includes a plurality of antenna elements that are spaced to define active areas. A matrix switch flexibly connects the plurality of antenna elements to an exciter circuit. Independent switches are selectively switched such that an electric field is generated between at least two antenna elements whereby radio frequency identification tags in the vicinity of the two antenna elements.

U.S. Pat. No. 6,411,199 is directed generally to the field of Radio Frequency (RF) identification systems employing an electronic transponder and a transponder reader which emits an RF interrogation signal at a first frequency which powers the electronic transponder and enables it to transmit a response on a second frequency (usually a lower frequency).

The patents listed above all relate to semiconductor RFID tags or sensors.

SUMMARY OF INVENTION

This invention places a unique identifier on the acoustic wave produced by the encoded IDT in step c as outlined above to allow an algorithm within the interrogation transceiver to separate out the multiple signals, and actually changes the finger geometries of the IDTs to encode specific identifiers which can be used to separate out multiple tags or sensors.

This invention introduces an encoding concept that is applicable to a variety of passive surface acoustic wave (SAW) radio frequency identification (RFID) tags or sensors for MUD. Multiple signals from the tags or sensors, all responding simultaneously when interrogated by a single wireless reader, could occur when several RFID tags or sensors are spatially located very close to each other. Such multiple RFID tags or sensors would all be within the usable radiation pattern of the reader's single antenna and produce multiple collisions when received back at the reader. This encoding scheme is embedded into the geometries of the SAW devices to be used in detecting and identifying multiple devices within the reader's single antenna's range. The encoding method uses a phase modulation of selected finger pairs on each SAW device which in effect places a unique identifier on the tag or sensor's returned impulse response. An algorithm is then used to separate out each unique identifier and reconstruct the unique identification number of each tag or sensor.

According to the invention, a group of SAW RFID tags or sensors each has a transducer with interdigitated fingers, a different set of fingers in each tag or sensor being reversed in phase to cause the tag or sensor to provide a unique identifier in a returned impulse response produced by the tag or sensor when interrogated by an interrogation signal.

Each tag or sensor may have a single pair of phase reversed interdigitated fingers. Alternatively, each tag or sensor may have multiple adjacent pairs of phase reversed interdigitated fingers. Advantageously, the phase reversed interdigitated fingers do not occupy the extreme end of an elongated transducer which is closest to either reflectors or other finger arrays thereof.

The present invention also provides a method of distinguishing between responses produced by a group of SAW RFID tags or sensors having transducers with interdigitated fingers when interrogated by an interrogation signal, including phase reversing a different set of fingers in each tag or sensor to cause the tag or sensor to provide a unique identifier in the returned impulse response.

The method may also include providing an interrogation reader to receive responses from the SAW RFID tags or sensors and distinguish therebetween by vector analysis. The vector analysis may include comparing said responses with predetermined vector models for information encoded in the RFID tags or sensors. The predetermined vector models may be stored in a programmable look-up table within the interrogation reader.

The method may also include determining probable vector combinations from the compared responses. Variation within the probable vector combinations may be detected. The method may include selecting a probable phase change within the encoded information to compensate for a detected variation.

The detection of a variation and selecting a probable phase change within other RFID encoding information may be repeated to compensate for the variation detected. The detecting and selecting may be repeated until all probable vector combinations which contain the implemented device encoded information are determined.

DESCRIPTION OF DRAWINGS

Embodiments of the invention will now be described, by way of example, with reference to the accompanying drawings, of which.

DESCRIPTION OF PREFERRED EMBODIMENTS

Figure 1:
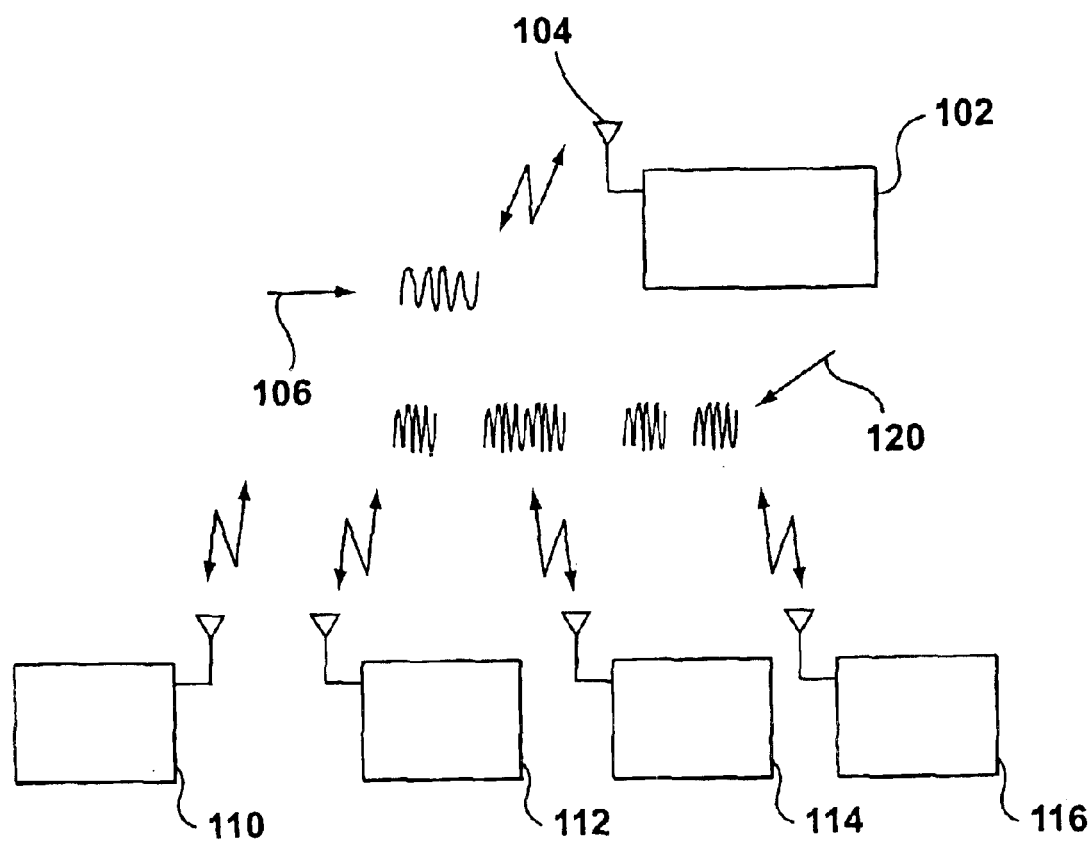
FIG. 1 shows a simple system having a reader transceiver interrogating several SAW RFIDs configured either as identification or sensor devices simultaneously with an RF signal.

Referring to the drawings, the present invention provides an encoding concept which can be applied to IDT based SAW RFID tag and sensor devices to enable multi-user detection to be effected. Collision of signals from multiple devices all responding simultaneously to an interrogating signal can occur when several of these devices are spatially located very close to each other and in the range of a reader transceiver 102 as shown in FIG. 1. The reader transceiver 102 is either manually or automatically controlled to emit an interrogating RF signal 106 through its antenna 104. The interrogating RF signal 106 adheres to the radiation pattern of the antenna 104 and connects with devices within its range, for example multiple SAW RFID devices 110, 112, 114 and 116. These devices may be configured either as identification devices or sensor devices. The interrogation signal 106 is received by each SAW device 110, 112, 114 and 116 within its range, and each SAW device responds back to the reader transceiver 102 with a modified RF signal 120.

Figure 2:
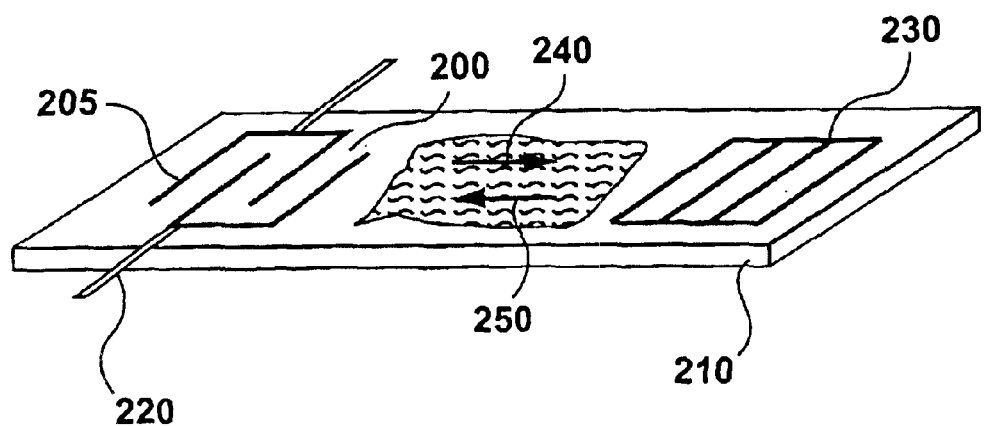
FIG. 2 shows basic elements of a reflective type SAW identification or sensor device.

The basic elements of typical SAW identification or sensor devices are shown in FIG. 2. A thin film interdigital transducer (IDT) 200 having multiple sets of individual IDT fingers 205 is located on a suitable piezoelectric substrate 210. Attached to IDT 200 is an antenna 220 which receives and passively returns RF signals from and to the reader transceiver 102. Depending on the final configuration of the SAW identification or sensor devices, a set of reflectors 230 may be suitably positioned on one or both sides of the IDT 200 and may be duplicated to provide multiple arrays of reflective sections. An electrical to acoustic transformation takes place within the IDT 200 and an acoustic wave 240 propagates away from the IDT 200.

In some instances, the IDT 200 is elongated along the acoustic wave propagation axis and multiple sets of fingers grouped into arrays are contained within. The same electrical to acoustic transformation takes place for each set of multiple IDT fingers 205 suitably grouped in various arrays along the total IDT structure to produce multiple acoustic waves 240, 250 travelling in both directions. A different method of producing both an incident and reflected acoustic wave 240, 250 would be to configure the device to emit an acoustic wave 240 from an IDT 200 and place either a single or multiple reflectors 230 to produce an oppositely travelling reflected acoustic wave 250 which will return to the IDT 200.

This invention provides an encoding method which is embedded into the geometries of the SAW devices to assist in detecting and separating signals from the multiple devices. The encoding method uses a phase reversal of selected finger pairs within the IDT 200 on each SAW device which in effect places a unique identifier on the tag or sensor's returned impulse response.

Figure 3A:
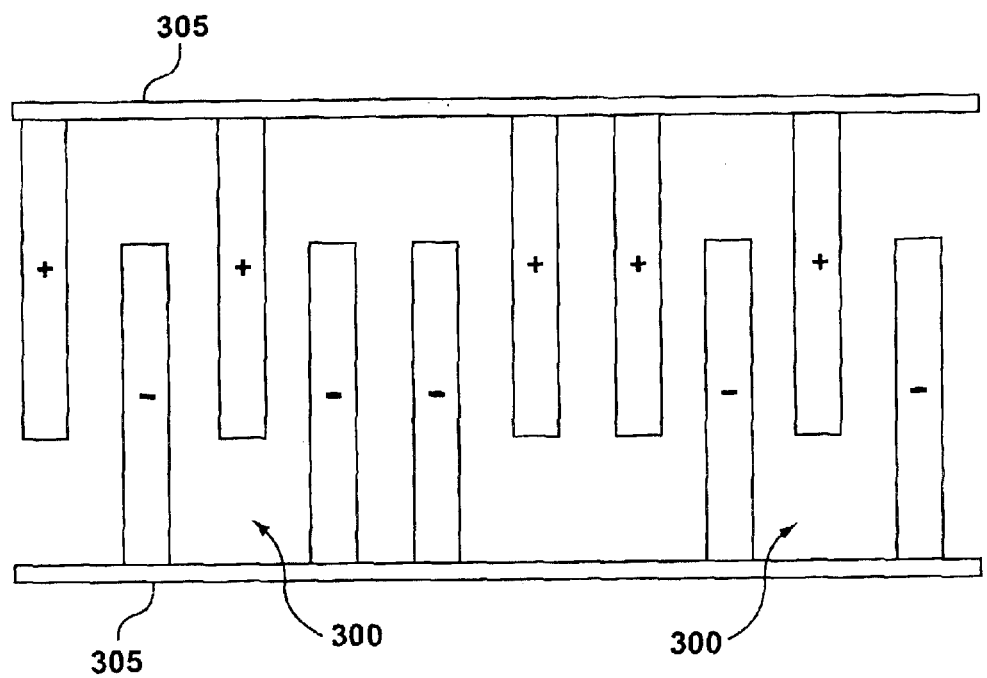
FIGS. 3(a) and 3(b) show finger placement and resulting phase adjusted acoustic wave respectively representative of the encoded sequence +1, +1, −1, +1 and +1.
Figure 3B:
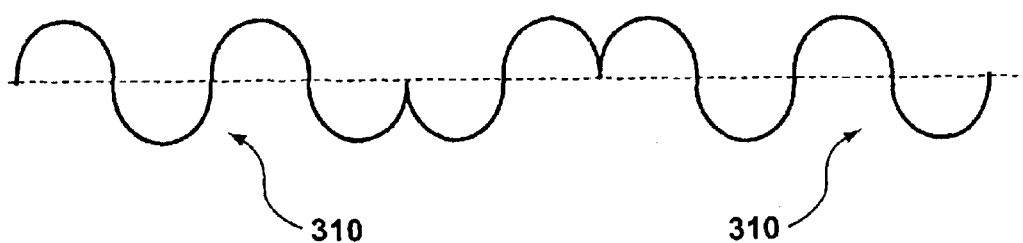

As an example, FIGS. 3(*a*) and 3(*b*) depict the finger placement and resulting phase adjusted acoustic wave representative of the encoded sequence +1, +1, −1, +1 and +1. A top view of the phase encoded IDT 300 illustrates the placement of the +ve and −ve finger pairs to achieve phase reversal of the center pair. The phase encoded finger pairs connect to the bus bars 305 which are normally connected to the antenna 220. A pictorial representation of the acoustic wave resulting from an electrical to acoustic transformation which emerges from either one or both sides of the IDT illustrates the phase reversal of the acoustic wave 310.

Figure 4:
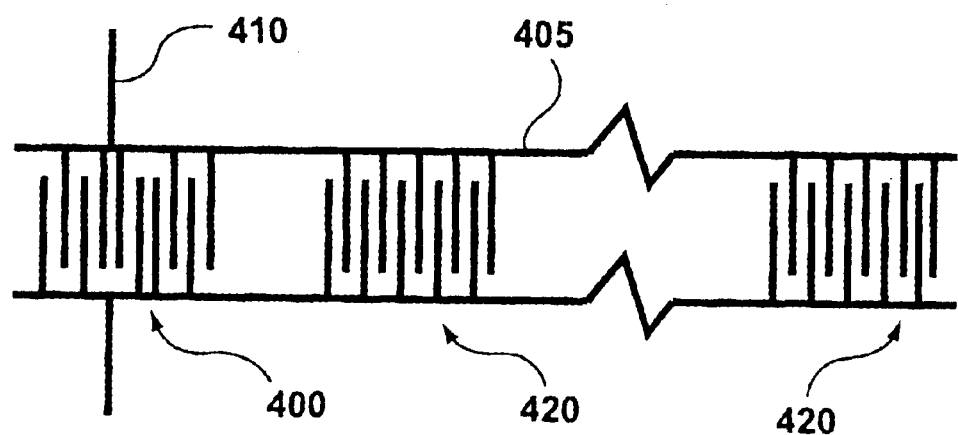
FIG. 4 shows an elongated interdigital transducer type of SAW identification or sensor device with a multi user detection encoded IDT array =1, +1, −1, +1 and +1, with multiple separate coded arrays.

A SAW RFID tag in accordance with an embodiment of the invention shown in FIG. 4 may utilize a single elongated IDT with an encoded multi user detection IDT 400 connected via bus bars 405 to an antenna structure 410. Also attached to the bus bars 405 is one or more multiple coded arrays 420. The coding typically used for these arrays 420 may be in the form of an m-ary phase coding for a higher bit efficiency or on-off keying (OOK).

Figure 5:
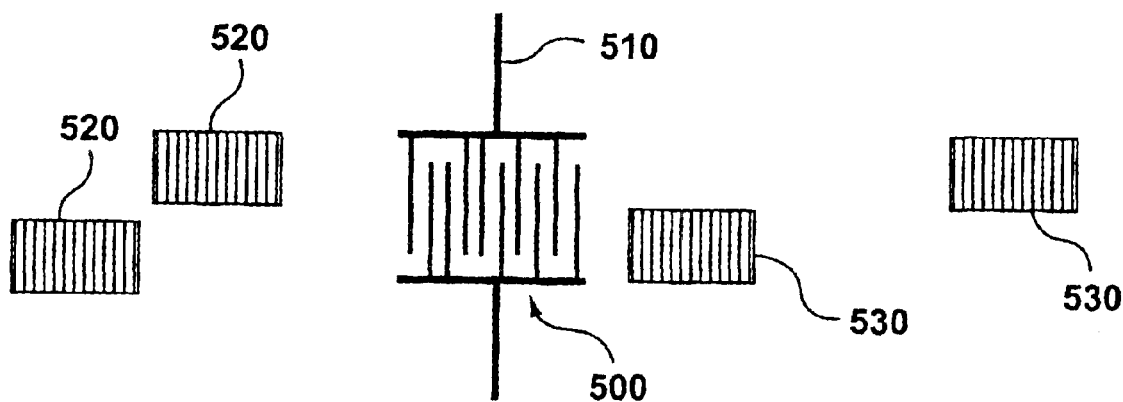
FIG. 5 shows a interdigital transducer with a multi user detection encoded IDT array with multiple separate reflected phase or on-off keying coded arrays, the encoding sequence for this instance being +1, −1, +1, +1 and +1.

Another embodiment of multi-user detection using a reflective SAW based RFID tag or sensor is illustrated in FIG. 5. The MUD encoded IDT array 500 communicates with the reader transceiver 102 via an antenna 510. Located in a position to reflect an incident acoustic wave generated from the MUD encoded IDT 500 are sets of coded reflectors 520, 530. The reflectors 520, 530 can consist of single or multiple groups of reflectors. These reflectors maybe configured either as m-ary phase coding or on-offkeying (OOK).

Figure 6A:
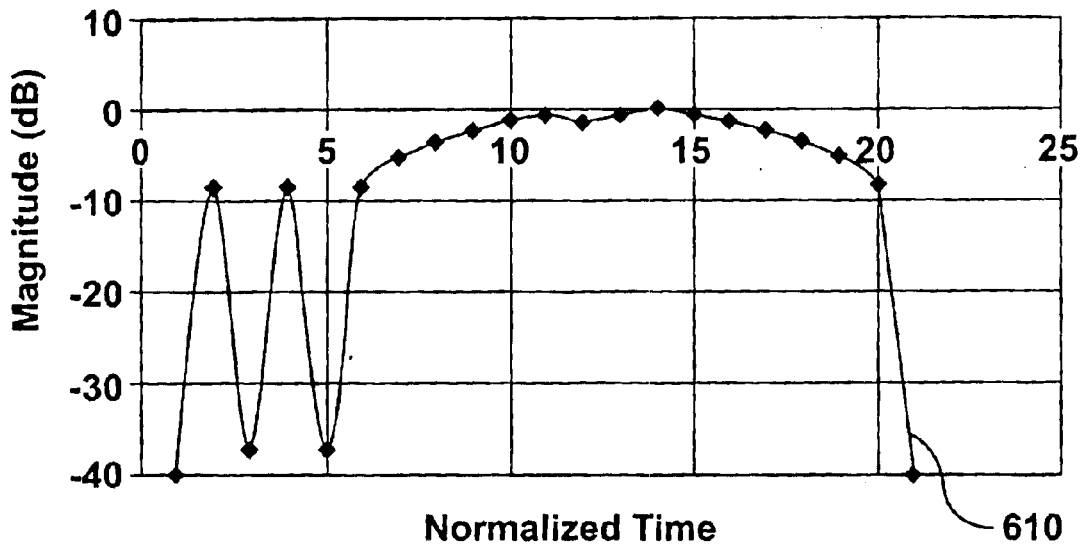
FIGS. 6(a) and 6(b) show normalized magnitude and phase graphs of MUD encoded extended IDT array showing the response from the first four-level phase shift keying (4-PSK) array.
Figure 6B:
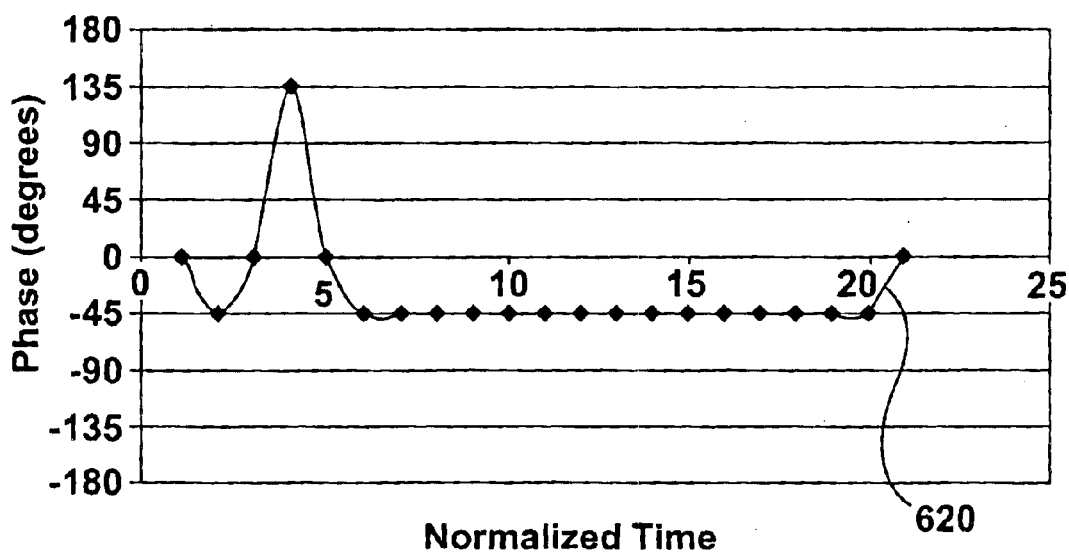

The effects of encoding a IDT array for multi-user detection in accordance with the invention can be seen in the predictive Excel plots of FIGS. 6(*a*) and 6(*b*). For this simulation, a MUD encoded extended IDT with an encoding scheme of +1, +1, +1, +1, +1, +1, +1, −1, −1 and +1 was configured as an RFID similar to that shown in FIG. 4 with a 4-PSK modulation scheme for the single extended IDT array (0.5−j 0.5). The plots illustrated in FIGS. 6(*a*) and 6(*b*), namely normalized magnitude 610 and phase 620, are representative of the signals on the bus bars of the device from an acoustic wave being launched from the encoded IDT and travelling towards and interacting with the 4-PSK encoded IDT array and simultaneously an acoustic wave being launched from the 4-PSK encoded IDT array and travelling towards and interacting with the encoded IDT.

Figure 7A:
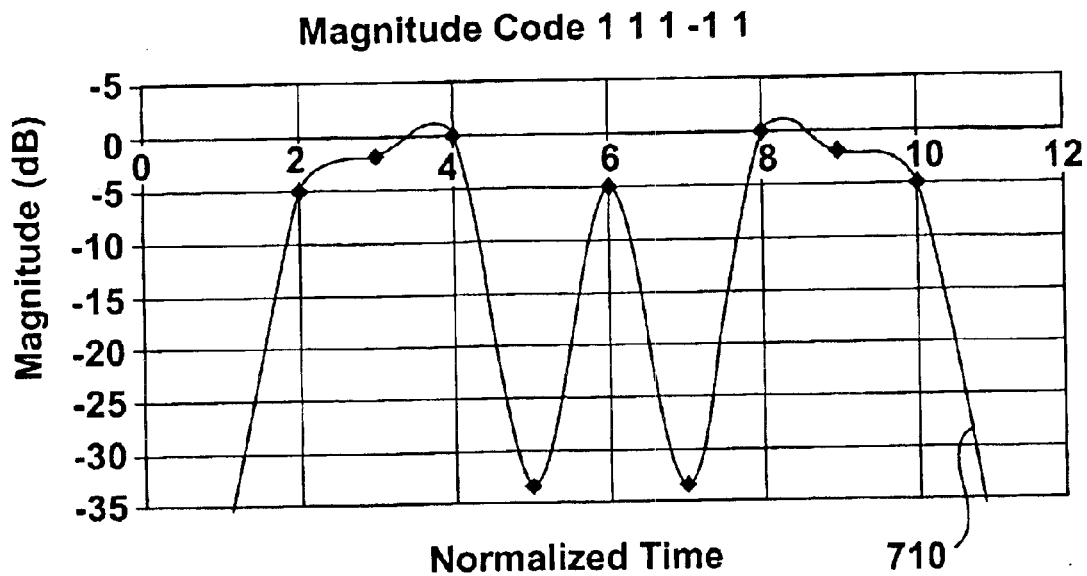
FIGS. 7(a) and 7(b) show normalized magnitude and phase graphs of a encoded IDT array after a convolution of its reflected image from a set of reflectors with a reflection coefficient, $\Gamma=0.5+j\ 0.5$.
Figure 7B:
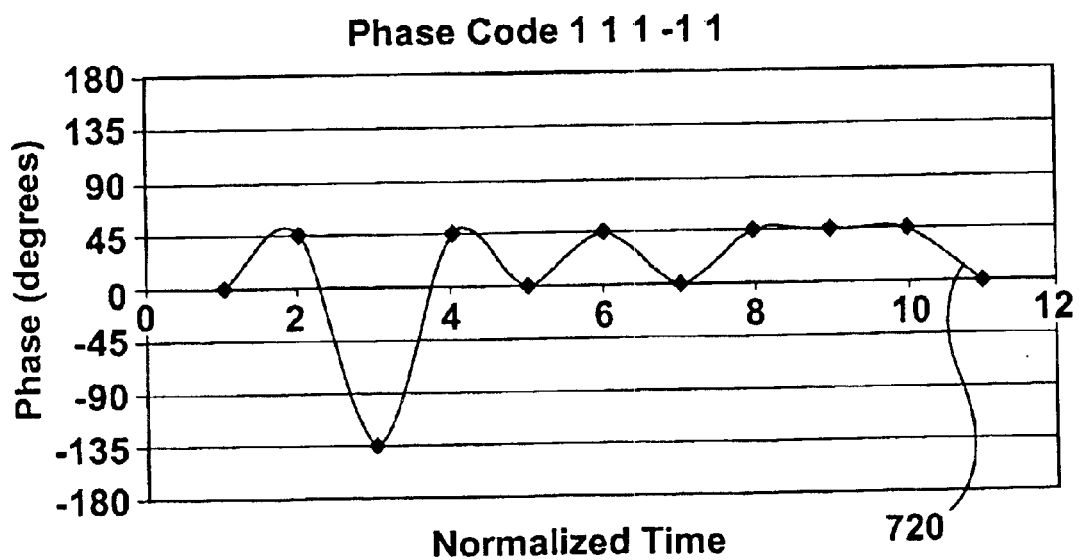
Figure 8A:
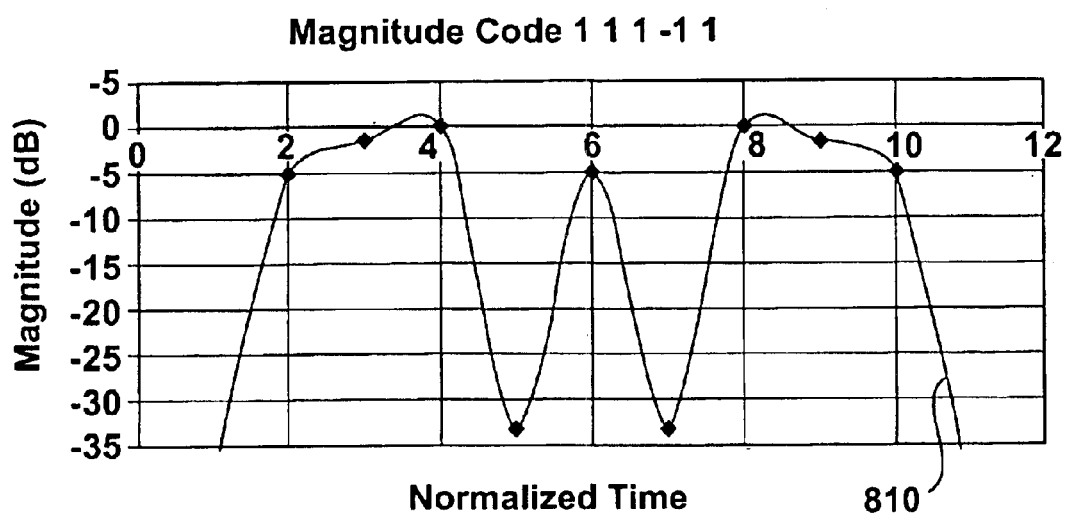
FIGS. 8(a)-8(d) show normalized magnitude and phase graphs of two separate SAW RFID MUD encoded IDT arrays after a convolution process with a reflection coefficient, $\Gamma=0.5+j\ 0.5$ for both RFIDs.
Figure 8B:
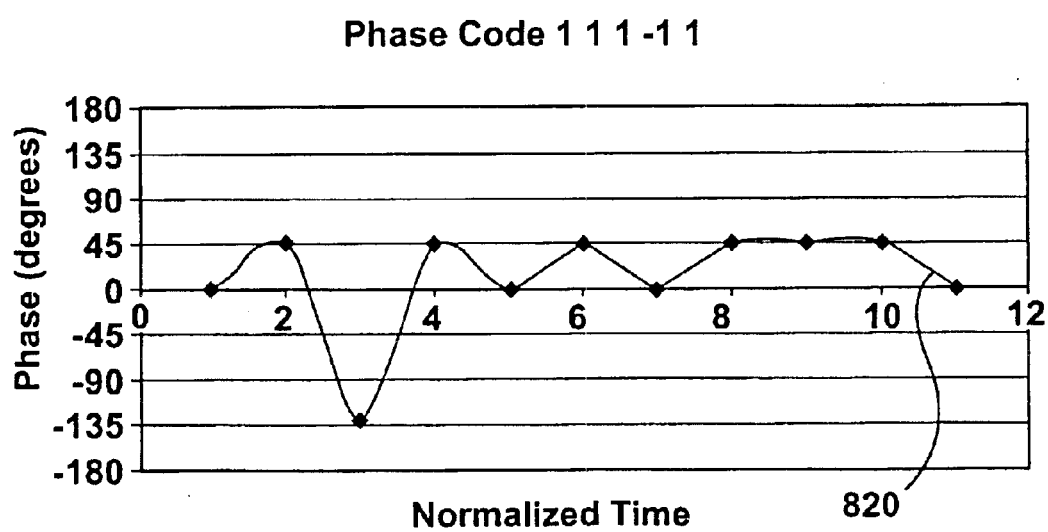
Figure 8C:
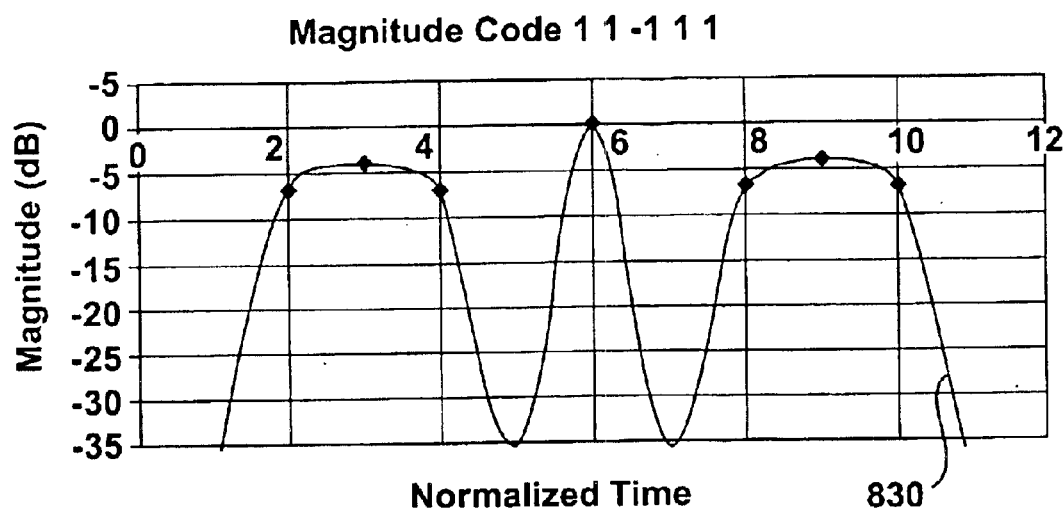
Figure 8D:
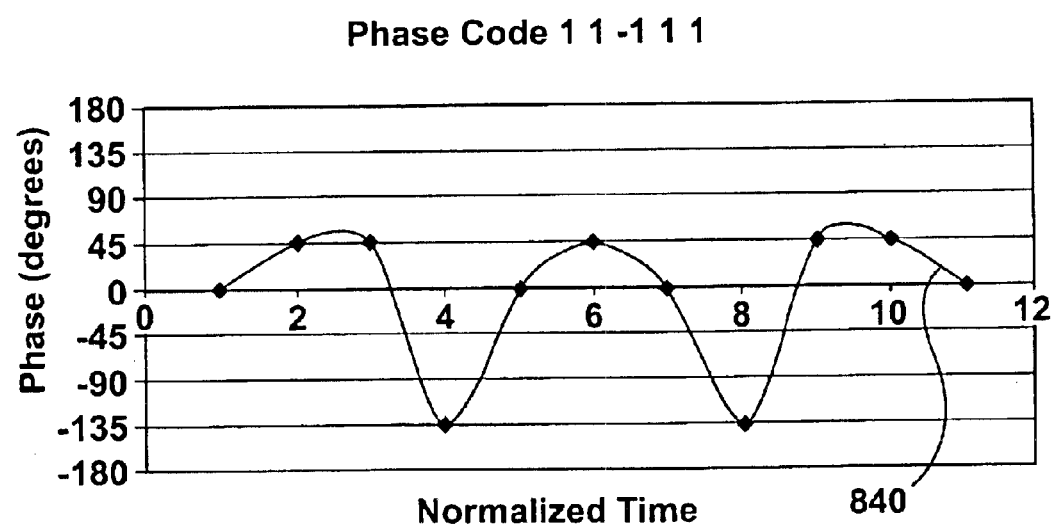

In another embodiment, a MUD encoded IDT with an encoding scheme of +1, +1, +1, +1 and −1, was configured as a reflective RFID similar to that shown in FIG. 5 with a 4-PSK modulation scheme for the reflectors and a reflection coefficient, Γ=0.5+j 0.5. The plots illustrated in FIGS. 7(*a*) and 7(*b*) are representative of an acoustic wave being launched from the encoded IDT and reflecting back to the encoded IDT by a single reflector array. As the reflected acoustic wave re-enters the encoded IDT, it is time reversed and convolves with the encoded IDT as it passes through. This convolution process produces the normalized magnitude 710 and phase 720 of the regenerated electrical signal which is transmitted back via the RFID's antenna 220 to the reader transceiver 102.

It should be noted that the finger group at the extreme end of the IDT which is closest to either the reflectors or other finger arrays in an elongated IDT, is not encoded. This allows for a reference angle which is common to all SAW RFIDs to be incorporated to assist the reader transceiver 102 in solving any phase ambiguities.

The comparison of two separately encoded SAW reflective RFID tags with different IDT encoding is shown in FIGS. 8(*a*) and 8(*b*). Here, the two encoding sequences for the IDTs are +1, +1, +1, −1 and +1, as was shown in FIG. 7, and +1, +1, −1, +1 and −1. The reflection coefficient for the two sequences is kept constant at Γ=0.5+j 0.5. Comparisons between the normalized magnitude plots 810 and 830 (FIGS. 8(*a*) and 8(*c*)) and the phase plots 820 and 840 (FIGS. 8(*b*) and 8(*d*)) show how, by encoding the IDT differently, a unique signal vector results from each SAW reflective RFID with the identical number of fingers within the IDT and identical reflection coefficients within the first reflector groups of each RFID.

Figure 9A:
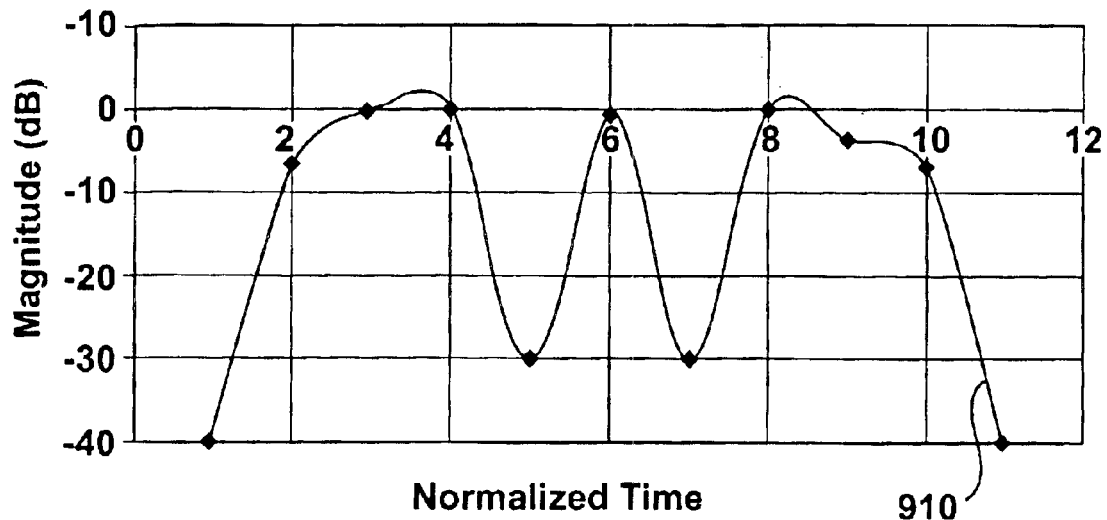
FIGS. 9(a) and 9(b) show computed normalized magnitude and phase graphs of three separately MUD encoded IDT arrays from a reflective type SAW identification or sensor device that would be received by the Reader Transceiver.
Figure 9B:
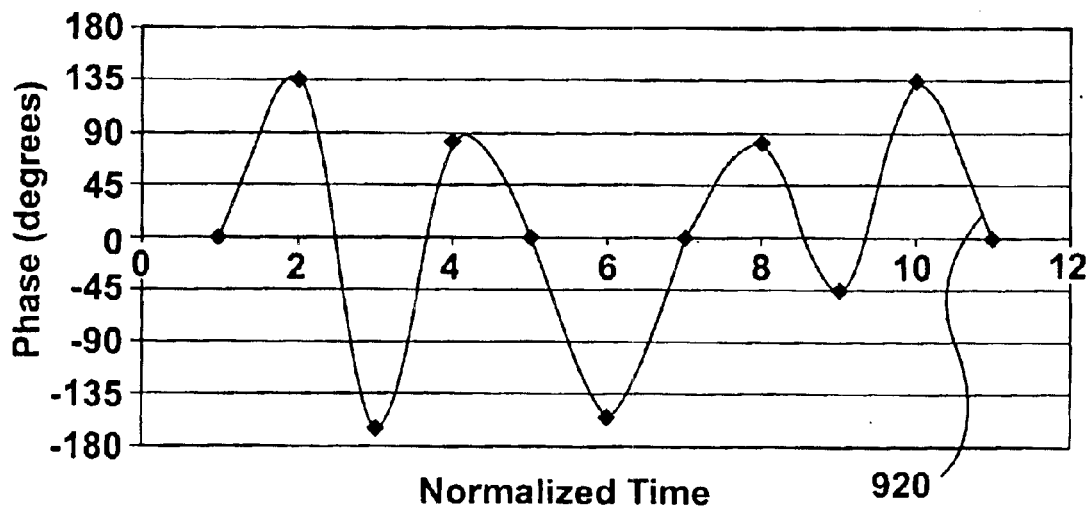

Even though each separate encoded SAW RFID or sensor device is uniquely coded, the Reader Transceiver 102 will still see a vector summation of all of the returned signals 120 from the several SAW devices 110, 112, 114 and 116 within the range of the Reader Transceiver. FIGS. 9(*a*) and 9(*b*) illustrate the computed vector summation of the normalized magnitude 910 and phase 920 of three differently encoded SAW RFID or sensor devices. The three codes are: Code #1 =+1, +1, +1, −1 and +1 with Γ=0.5+J 0.5, Code #2=+1, −1, +1, +1 and +1 with Γ=0.5+j 0.5, and Code #3=+1, +1, −1, +and +1 with Γ=0.5+j 0.5.

Figure 10:
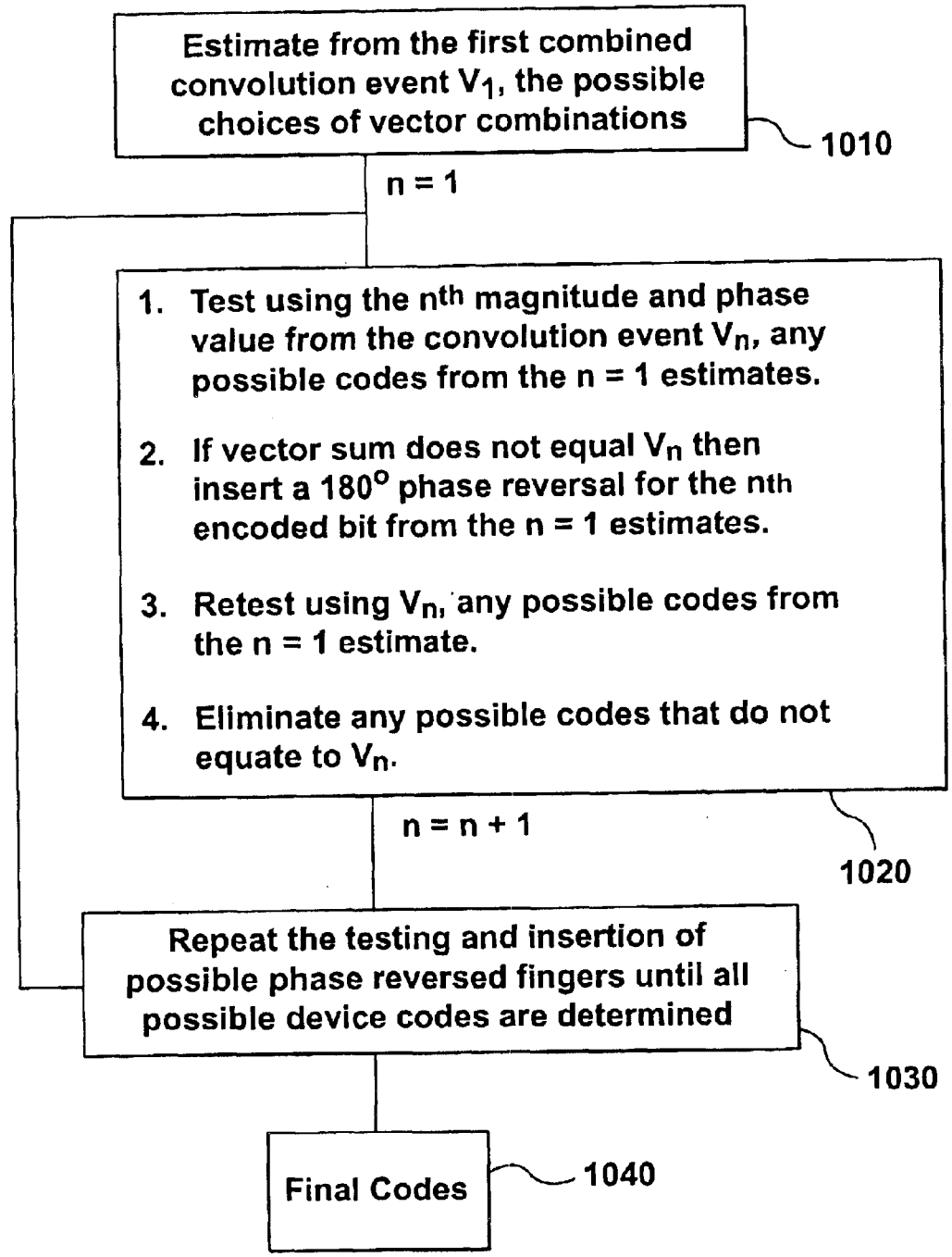
FIG. 10 shows an algorithm to compute each individual code from the magnitude and phase vector of separately MUD encoded IDT arrays that would be received by the Reader Transceiver.

To separate out each individual device, an algorithm must be established to determine the magnitude and phase of each of the event points, which is defined as the convolution point of each individual returned acoustic wave back on to the encoded fingers of its encoded IDT. For devices spatially located within a metre of each other, the algorithm shown in FIG. 10 is used to determine the individual identification codes of the SAW RFID or sensor devices. The algorithm makes use of the vector summation process that takes place at the Reader Transceiver 102 and the knowledge that unique phase values are attributed to the m-ary phase coding schemes employed by the reflectors.

Step 1010 of the algorithm computes all possible variations of the codes given that the encoded IDT does not encode the outer bits. This allows the vector summation to be free of any phase reversals for both the first (n=1) and last (n=n) convolution event. Step 1020 then eliminates, using the $n^{th}$ magnitude and phase value from the convolution event, any possible codes from the n=1 estimate. If a non-PSK phase value is detected, then at least one code has an 180° phase shift for the encoded bit. Further estimation using vector addition takes place to determine the possible choices which equal the event vector and eliminate all that do not equate. Step 1030 increments the convolution event counter n, and repeats the computation of step 1020. Finally, the separate codes are computed and identified 1040.

EXAMPLE

The following is an example of how an algorithm using a set of rules can be used to sort out how many RFID tags or sensors are responding to a single interrogation pulse from a reader using vector analysis. The algorithm computes both the different IDT encoding scheme and the correct identification code of each device.

A 10-bit encoded IDT is excited by an interrogation signal via the antenna and an incident wave ($V_{in}$) propagates towards a set of binary encoded PSK modulated reflectors and then reflects back ($V_{ref}$) into the same IDT. The following illustration shows a bit stream composed of n bits with the dashed fingers phase reversed propagating towards the reflector with an offset phase shift keyed (PSK) reflection coefficient $\Gamma = 0.5 + j\,0.5$.

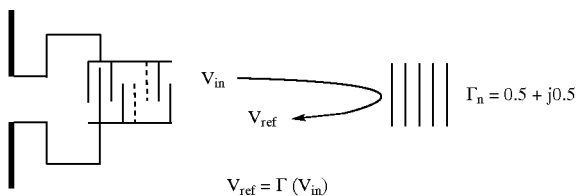

An offset 4-PSK pattern used for this example is;

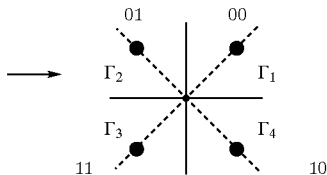

A number of 10-bit encoded RFID devices were then randomly chosen to demonstrate the separation capability of the algorithm. A total of 19 sampled voltages will be generated as the 10-bit code is reflected back from the reflectors onto the same 10-bit encoded IDTs. A composite signal is then received back at the reader comprising of the sum of the RFID or sensor devices.

The algorithm begins by observing the first summed voltage $V_1$ that the interrogation reader has received. $V_1$ is the sum of the "n" number of RFID or sensor devices and is the result of each reflected wave from each RFID device, passing through the first set of fingers in each of the device's encoded IDT.

From $V_1 = 0.0 - j1.0 = 1.0\underline{/-90°}$

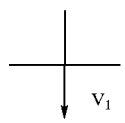

Possible number of coded RFID devices and the values of their first reflection grating segment are derived from the first voltage sum $V_1$ are then, n=2, 3, 4, 5, 6 . . . ; Since phase reversals are not allowed in the first or last bit, the odd number of vectors (3, 5 . . . ) cannot add to $V_1$ and are eliminated.

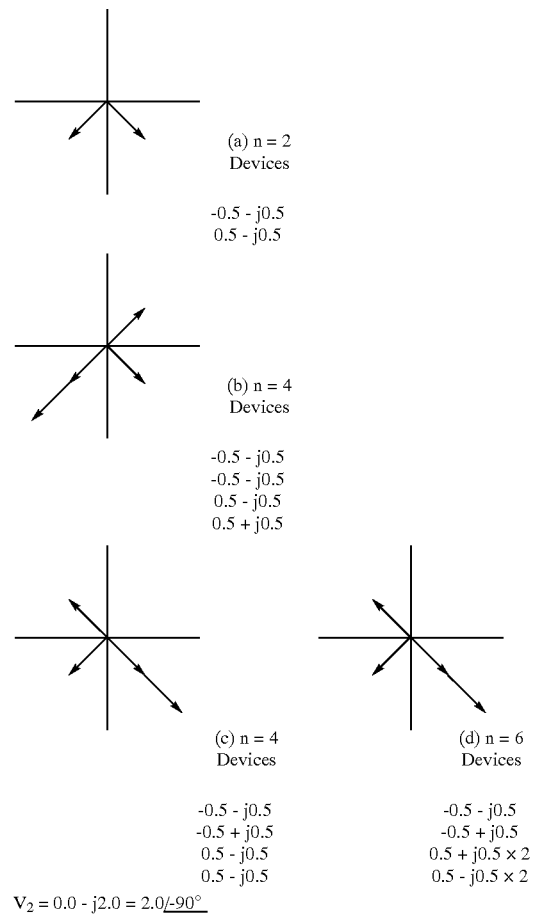

There are now two IDT fingers being excited from the reflected waves passing through the IDT. Therefore with "n" devices, the received voltages sum to a larger component.

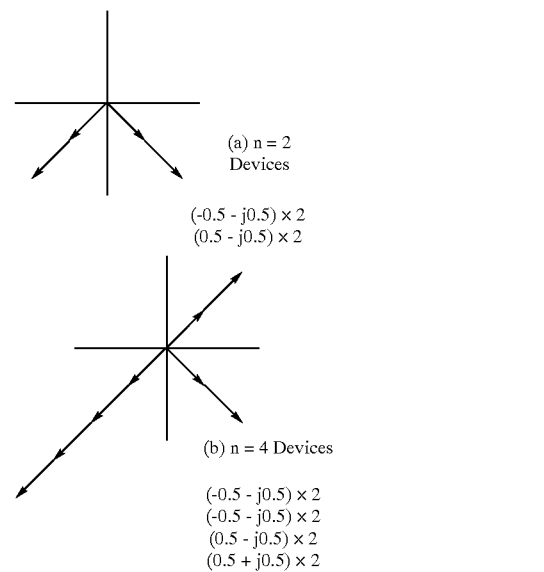

The same would apply to (c) and (d), therefore, there are no phase reversal in the device codes.

$V_3 = -2.0 - j1.0 = 2.2\underline{/-153°}$

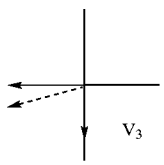

The −153° is a non-standard 4-PSK angle, therefore One of the bits may have a phase reversal.

$V_3$ is the sum of three acoustic waves of $V_{ref}$ convolving with three finger pairs of the IDT for all "n" number of colliding RFID devices.

Start with (a) n=2 devices, but assume one has a biphase bit in position three that will phase reverse 2 (dotted vectors) of the 3 finger voltages.

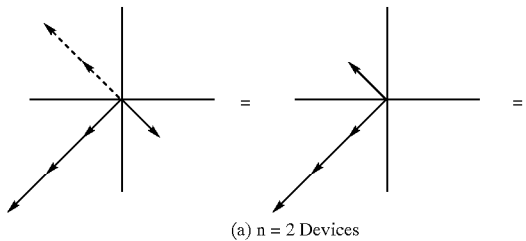

(a) n = 2 Devices

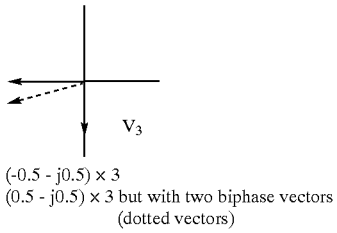

(-0.5 - j0.5) × 3
(0.5 - j0.5) × 3 but with two biphase vectors (dotted vectors)

Therefore there is a possibility that two RFID device codes are colliding (n=2) with code 1 having an encoded IDT of (1111111-111) and the device identification code having a phase modulation of Γ=0.5−j 0.5.

Continue with $V_3$ for n=4, 6, . . .

Configure (b) with n=4 for $V_3$

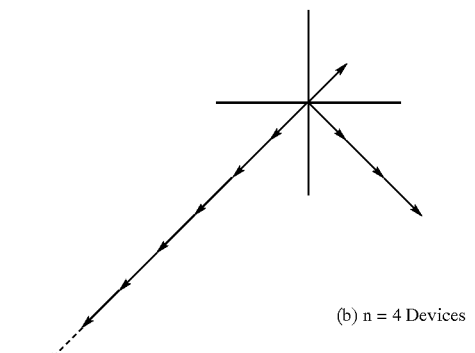

(b) n = 4 Devices (-0.5 - j0.5) × 3
(-0.5 - j0.5) × 3
(0.5 - j0.5) × 3
(0.5 + j0.5) × 3 but with two biphase vectors This configuration will produce a total vector of −2.0−j 1.0=2.2/−153°, which is a possible solution. A similar possible solution appears for (b) when the biphase code is attached to Γ=0.5−j 0.5.

Configure (c) with n = 4 for $V_3$ and Γ = 0.5 - j0.5

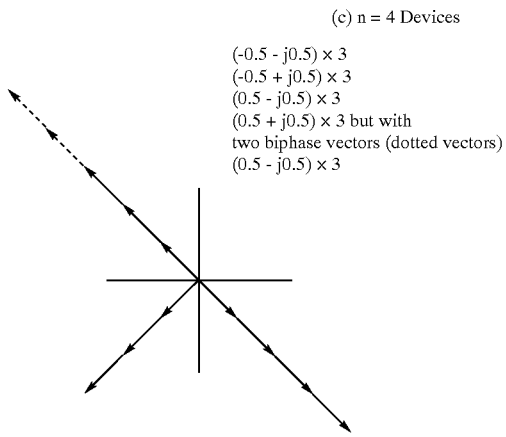

(c) n = 4 Devices (-0.5 - j0.5) × 3
(-0.5 + j0.5) × 3
(0.5 - j0.5) × 3
(0.5 + j0.5) × 3 but with two biphase vectors (dotted vectors)
(0.5 - j0.5) × 3

This configuration will then produce a total vector of −2.0−j 1.0=2.2/−153°, which is another possible solution.

The results for V3 therefore only confirm that one of the devices has a biphase finger in the 3'd position from the end of the IDT. The number of devices is still unconfirmed.

$V_4 = 0.0 - j\,4.0$

Try configuration (a)

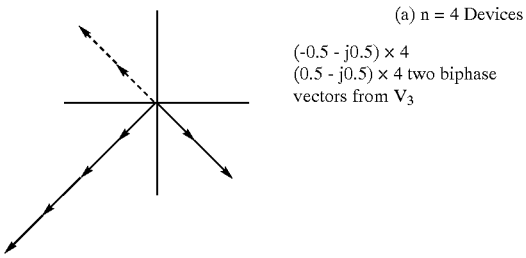

(a) n = 4 Devices (-0.5 - j0.5) × 4
(0.5 - j0.5) × 4 two biphase vectors from $V_3$ This configuration will not provide the correct solution, nor will assuming a pair of biphase fingers in position four with Γ=0.5−j 0.5. Therefore, eliminate configuration (a).

Try configuration (b)

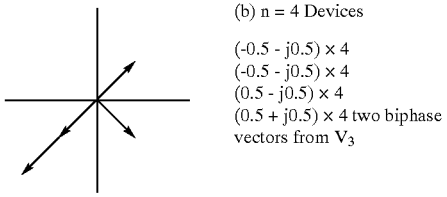

(b) n = 4 Devices (-0.5 - j0.5) × 4
(-0.5 - j0.5) × 4
(0.5 - j0.5) × 4
(0.5 + j0.5) × 4 two biphase vectors from $V_3$ This configuration will not provide the correct solution, nor will assuming a pair of biphase fingers in position four with Γ=0.5−j 0.5.

Trying a pair of biphase fingers in position four with Γ=−0.5−j 0.5 will produce a possible solution.

Try configuration (c)

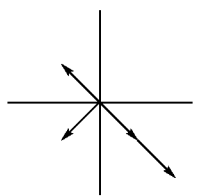

(c) n = 4 Devices
(-0.5 - j0.5) × 4
(-0.5 + j0.5) × 4
(0.5 - j0.5) × 4
(0.5 - j0.5) × 4 two biphase vectors from $V_3$ This configuration will not provide the correct solution.

Trying a pair of biphase fingers in position four with $\Gamma = -0.5 + j\,0.5$ will produce a possible solution.

Trying a pair of biphase fingers in position four with $\Gamma = -0.5 - j\,0.5$ will not produce a solution.

Trying configuration (d) will not provide the correct solution, nor will assuming a pair of biphase fingers in position four with other reflection coefficients as well.

Therefore there are at least four devices.

Device #1 = 1111111-111 with $\Gamma = 0.5 - j\,0.5$
Device #2 = 1111111-1111 with $\Gamma = -0.5 + j\,0.5$ $V_5 = 2.0 - j7.0 = 7.3 \underline{/-74°}$

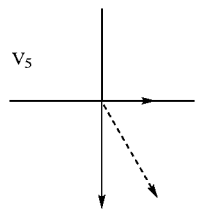

Note: Device #1's code will line up within the IDT as shown;

This will cancel any of the biphase effect for this device only. Device #2 code will exhibit biphase cancellation within the IDT as shown below;

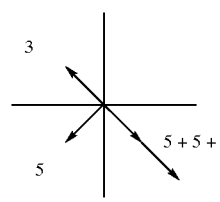

(c) n = 4 Devices
(-0.5 - j0.5) × 5
(-0.5 + j0.5) × 5 (Code #2) 1 1 1 1 1 1 - 1 1 1 1
(0.5 - j0.5) × 5 (Code #1) 1 1 1 1 1 1 - 1 1 1
(0.5 - j0.5) × 5

Which therefore produces;

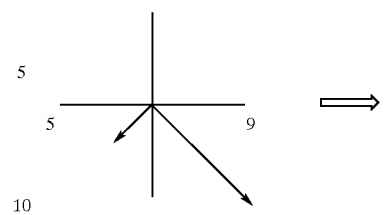

Therefore $V_5$ confirms the codes and reflection coefficients of Devices #1 and #2.

$V_6 = 2.0 - j4.0 = 4.5 \underline{/-63°}$

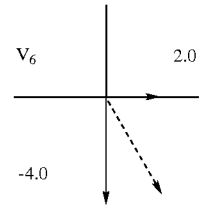

Note: Device #1's code will line up within the IDT as shown;

Device #2 code will line up within the IDT as shown;

Try the following configuration,

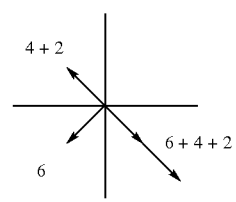

(c) n = 4 Devices
(-0.5 - j0.5) × 6
(-0.5 + j0.5) × 6 (Code #2) 1 1 1 1 1 1 - 1 1 1 1
(0.5 - j0.5) × 6 (Code #1) 1 1 1 1 1 1 1 - 1 1 1
(0.5 - j0.5) × 6

This result does not equal $V_6$, therefore assume that another biphase code appears in the $6^{th}$ finger pair position.

(c) n = 4 Devices (-0.5 - j0.5) ×6 (Code #3) 1 1 1 1 -1 1 1 1 1 1
(-0.5 + j0.5) × 6 (Code #2) 1 1 1 1 1 1 -1 1 1 1
(0.5 - j0.5) × 6 (Code #1) 1 1 1 1 1 1 1-1 1 1
(0.5 - j0.5) × 6

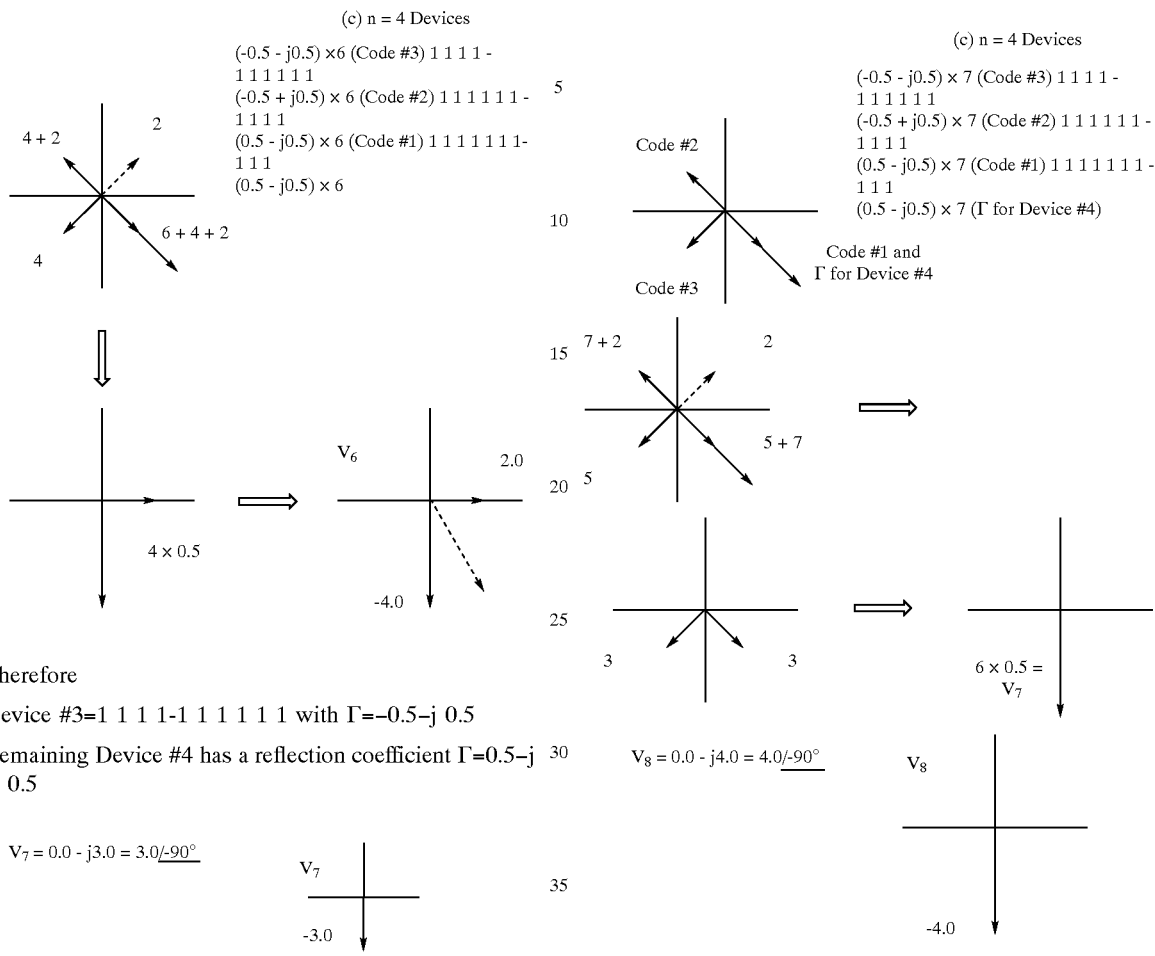

Therefore

Device #3=1 1 1 1-1 1 1 1 1 1 with $\Gamma = -0.5 - j\,0.5$

Remaining Device #4 has a reflection coefficient $\Gamma = 0.5 - j\,0.5$ $V_7 = 0.0 - j3.0 = 3.0\underline{/-90°}$ Note: Device #1's code will line up within the IDT as shown;

1 1 1 1 1 1 - 1 1 1
   1 1 - 1 1 1 1 1 1 ... 1 1

Device #2 code will line up within the IDT as shown;

1 1 1 1 1 1 - 1 1 1 1
   1 1 1 - 1 1 1 1 1 1 1

Device #3 code will line up within the IDT as shown;

1 1 1 1 - 1 1 1 1 1 1
   1 1 1 1 1 - 1 1 1 1 1

Looking at (c) for $V_7$,

Looking at (c) for $V_8$, $V_8 = 0.0 - j4.0 = 4.0\underline{/-90°}$

This result does not equal $V_8$, therefore assume that another biphase code appears in the $8^{th}$ finger pair position of Device #4. This gives a correct $V_8$.

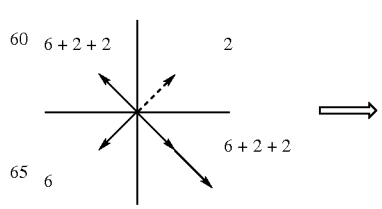

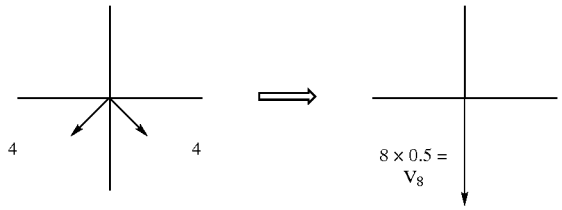

Final Summary
Device #1=1 1 1 1 1 1 1-1 1 1 with Γ=0.5−j0.5
Device #2=1 1 1 1 1 1 1-1 1 1 1 with Γ=−0.5+j0.5
Device #3=1 1 1 1-1 1 1 1 1 1 with Γ=−0.5−j0.5
Device #4=1 1-1 1 1 1 1 1 1 1 with Γ=0.5−j0.5

This algorithm is then repeated with the knowledge of the Device Codes to further determine the remaining reflection coefficients (Γ) that contain the encoded binary information for the device's identification code.

This method of encoding SAW RFID tags and sensors for multi-user detection works best when the spatial distance between devices is very small. This is in contrast to known techniques which implement smart antenna or variable transmit power technologies which require greater tag spatial separation in order to function effectively.

Other embodiments of the invention will now be readily apparent to a person skilled within the art.

What is claimed is:

1. A group of SAW RFID tags or sensors each having a transducer with interdigitated fingers, a different set of fingers in each tag or sensor being reversed in phase to cause the tag or sensor to provide a unique identifier in a returned impulse response produced by the tag or sensor when interrogated by an interrogation signal and thereby enable the different returned impulse responses and hence the SAW REID tags or sensors to be distinguished from one another when the tags or sensors are interrogated by the same interrogation signal.

2. A group of tags or sensors according to claim 1 wherein each tag or sensor has a single pair of phase reversed interdigitated fingers.

3. A group of tags or sensors according to claim 1 wherein each tag or sensor has multiple adjacent pairs of phase reversed interdigitated fingers.

4. A group of tags or sensors according to claim 1 wherein the phase reversed interdigitated fingers do not occupy the extreme end of an elongated transducer which is closest to either reflectors or other finger arrays thereof.

5. A method of distinguishing between responses produced by group of SAW RFID tags or sensors having transducers with interdigitated fingers when interrogated by an interrogation signal, including phase reversing a different set of fingers in each tag or sensor to cause the tag or sensor to provide a unique identifier in the returned impulse response.

6. A method according to claim 5 also including providing an interrogation reader to receive responses from the SAW RFID tags or sensors and distinguish therebetween by vector analysis.

7. A method according to claim 6 wherein the vector analysis includes comparing said responses with predetermined vector models for information encoded in the RFID tags or sensors.

8. A method according to claim 7 including storing the predetermined vector models in a programmable look-up table within the interrogation reader.

9. A method according to claim 7 including determining probable vector combinations from the compared responses.

10. A method according to claim 9 including detecting variation within the probable vector combinations.

11. A method according to claim 10 including selecting a probable phase change within the encoded information to compensate for a detected variation.

12. A method according to claim 10 including repeating the detection of a variation and selecting a probable phase change within other RFID encoding information to compensate for the variation detected.

13. A method according to claim 12 including repeating said detecting and selecting until all probable vector combinations which contain the implemented device encoded information are determined.

* * * * *